(12) United States Patent
Weekly

(10) Patent No.: US 8,514,583 B2
(45) Date of Patent: Aug. 20, 2013

(54) SYSTEM AND METHOD FOR MULTI-APPLICATION SOCKET

(75) Inventor: Roger D. Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 361 days.

(21) Appl. No.: 12/945,111

(22) Filed: Nov. 12, 2010

(65) Prior Publication Data

US 2012/0120576 A1    May 17, 2012

(51) Int. Cl.
*H05K 7/02* (2006.01)
(52) U.S. Cl.
USPC ........... 361/769; 361/770; 361/796; 439/591
(58) Field of Classification Search
None
See application file for complete search history.

(56) References Cited

U.S. PATENT DOCUMENTS

| | | | |
|---|---|---|---|
| 5,551,012 A | | 8/1996 | Chuang et al. |
| 5,745,346 A | * | 4/1998 | Ogawa et al. ................ 361/769 |
| 5,751,557 A | | 5/1998 | Silva |
| 5,959,845 A | | 9/1999 | Faucher |
| 6,862,190 B2 | * | 3/2005 | Olzak et al. .................. 361/768 |
| 7,001,185 B2 | | 2/2006 | Yang |
| 7,654,830 B2 | | 2/2010 | Lin |
| 2007/0103880 A1 | * | 5/2007 | Feng et al. .................... 361/796 |
| 2008/0311770 A1 | | 12/2008 | Fan |

OTHER PUBLICATIONS

Trent et al., "Fine Pitch Pad Array Carrier Sockets for Multichip Modules", Proceedings. 1992 IEEE Multi-Chip Module Conference MCMC-92 (Cat. No. 92CH3124-5), pp. 40-43.
Corbin et al., "Land grid array sockets for server applications", IBM Journal of Research and Development, Issue Date: Nov. 2002, vol. 46 Issue:6, on pp. 763-778.
Rathburn, J., "Removable chip module (RCMTM) with multi-mode compliance technology for BGA/CSP in production, test, and burn-in applications", IPC Chip Scale and BGA National Symposium. Proceedings. Pursuit of the Perfect Package, vol. 2, pp. 75-81, 1998.
Carson et al., "3-D Stacked Package Technology and Trends", Proceedings of the IEEE, vol. 97 , Issue: 1, Publication Year: 2009, pp. 31-42.

* cited by examiner

*Primary Examiner* — Anthony Q Edwards
(74) *Attorney, Agent, or Firm* — Hamilton & Terrile, LLP; Robert W. Holland

(57) ABSTRACT

A processor module socket accommodates processor modules of different sizes with adapters that align smaller-sized modules so that module pins align with desired contact points. The largest supported processor module engages with the socket in a conventional manner without the use of an adapter. Smaller processor modules engage within an adapter that in turn engages in the socket in a manner similar to the largest supported processor module. The contact points of the socket support different sized processor modules by keying logical functions based upon the type of processor module installed in the socket.

18 Claims, 5 Drawing Sheets

SYSTEM AND METHOD FOR MULTI-APPLICATION SOCKET

BACKGROUND OF THE INVENTION

1. Field of the Invention

The present invention relates in general to the field of computer processor sockets, and more particularly to a system and method for a multi-application socket.

2. Description of the Related Art

Computer systems typically include a number of printed circuit boards that support operation of processors for processing information. Often, the processors interface with a circuit board electronic complex through a socket coupled to the circuit board. For example, a land grid array (LGA) socket has a field of contacts that interface with processor pins located across the bottom surface of the processor. The socket contacts interface with wires of the printed circuit board, such as by soldering the wires to the contacts during manufacture of the printed circuit board. The processor is aligned so that pins on the bottom surface of the processor interface with associated contact points when the processor is placed in the socket. The processor is typically held in place in the socket by a lid or other device that is mechanically closed over the processor to lock the processor in a desired position.

One difficulty with printed circuit board processor sockets is that each processor module typically needs a socket that matches the processor module in size and pin layout. Often, a computer system can use different processors to perform similar functions at different performance levels. For example, a low cost organic processor module, such as a single chip module (SCM), might provide a processing function for a circuit board with a basic performance level while a more expensive processor module, such as a dual chip module (DCM), will perform the processing function with an advanced performance level. However, SCMs and DCMs often have different footprints both in the surface area of the module across which the pin array is laid out and the position of the pins. Typically, each processor module needs a specific socket built onto a circuit board that will fit the processor module's physical size and will match socket contact point layout with the processor module's pin array layout.

In some instances, an SCM and DCM will fit into a common socket. For example, if the die size of the integrated circuit in the different types of modules are small enough then the pins on the bottom of the module set the module size instead of the top portion of the module. If, on the other hand, the die size of the integrated circuit is relatively large compared with the room need for pin layout, then the location of pins can vary and the socket size will depend more upon die size, spacing and lidding requirements than pin layout. Where modules differ in size, different sockets are typically used to hold the modules.

SUMMARY OF THE INVENTION

Therefore, a need has arisen for a system and method which provides a multi-application socket to accept modules of different sizes.

In accordance with the present invention, a system and method are provided which substantially reduce the disadvantages and problems associated with previous methods and systems for installing processor modules into a socket of a circuit board. An adapter installs in the socket to allow the socket to accept a processor module having a smaller footprint than the socket accepts without the adapter. The adapter aligns pins of the processor module and contacts of the socket to support power, ground and logical functions.

More specifically, a socket interconnects with a circuit board to support electrical connections between the circuit board and a processor module installed in the socket. The socket has a footprint that accepts a large-sized processor module and a module engagement system that engages with the module to hold the module in places so that pins of the module align with contact points of the socket. For example, the socket has a perimeter with edges and a spring lever that biases the module into a position against edges opposite the spring lever. In order to accept a smaller sized processor module, an adapter is installed in the socket, such as by interacting with the module engagement system. The adapter has an opening with a perimeter sized to accept the footprint of the smaller sized processor module and an adapter engagement system to hold the smaller sized processor module in a position that aligns pins of the smaller sized processor module with predetermined contact points of the socket. Processor modules having a footprint as small as the footprint of the contact points within the socket will interact with the circuit board through the socket.

The present invention provides a number of important technical advantages. One example of an important technical advantage is that different physically sized modules will fit into a common socket, reducing the number of parts needed for computer system manufacture. The centroids of different sized modules do not have to align with each other or a center position of the socket depending upon static load control or pressure needed for high power dies and for thermal interface integrity. Multiple different sized modules can fit in one socket by having an adapter for each module that is smaller than the socket size. Alignment of a processor module in a socket is determined by A01 corner edge datums that support a tight pin field and allows modules having a footprint as large as the socket or as small as the pin field. A single piece adapter makes field installation relatively simple for ease of manufacture. Passive reallocation of printed circuit board wiring is automatically effected by detection of the type of module installed in the socket, including application of power between different chips of a DCM or different portions of a chip of an SCM. Allocation of wiring to contact points of the socket provides superset and shared electrical contact arrays.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
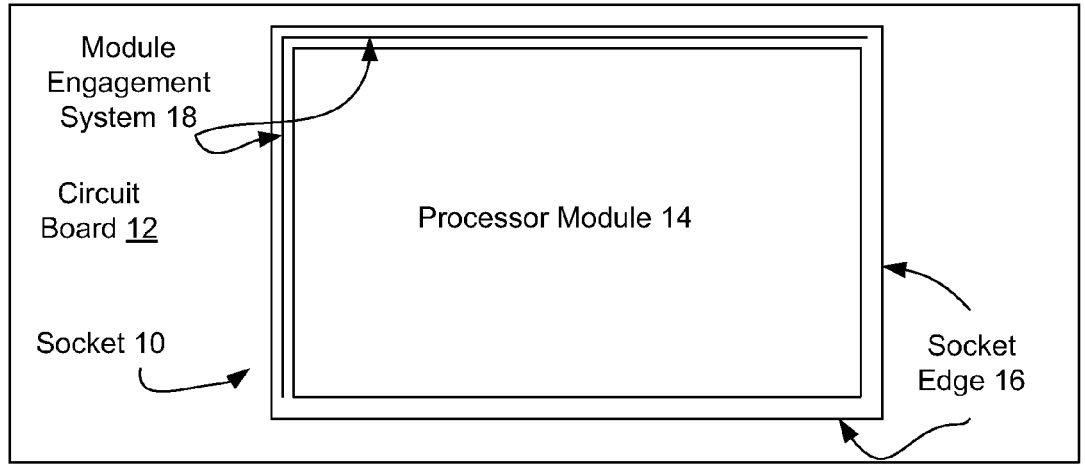
FIG. 1 depicts a top view of a socket disposed on a circuit board for accepting a processor module.

A system and method provides a socket that will accommodate two or more different sized processor modules by including an insert that aligns smaller sized processor modules in a desired location. For example, a dual chip module (DCM) has a larger foot print than a single chip module but a similar pin array layout. The adapter engages in the socket in a manner similar to the DCM and has an opening that engages with a single chip module (SCM) so that the SCM aligns with socket contact points in a manner similar to the DCM. Power and ground contact points of the socket provide similar power and ground functions for both the DCM and SCM. A key determines the function of logical contact points based upon whether the DCM or SCM is installed in the socket. The footprint of the socket matches the footprint of the largest module while the smallest sized socket is determined by the footprint of the pins.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 1A:
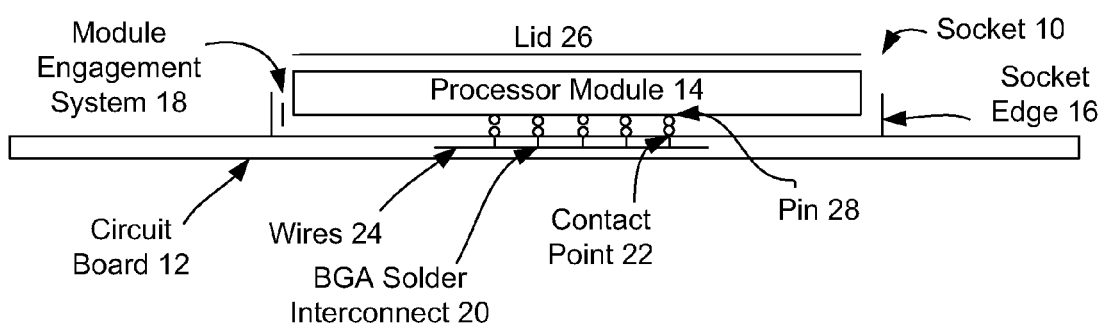
FIG. 1A depicts a side view of a full-sized processor module installed in socket.

Referring now to FIG. 1, a top view depicts a socket 10 disposed on a circuit board 12 for accepting a processor module 14. Socket 10 has a rectangular shape with four edges 16 that define the boundary of the largest sized processor module accepted in socket 10, such as a 67 mm by 57 mm dual chip module (DCM). A module engagement system 18 provides a biasing force along two perpendicular edges 16 to secure a processor module 14 against opposing edges 16. For example, module engagement system 18 is a pair of perpendicular spring levers that push against an installed processor module 14 to bias the processor module 14 against opposing edges 16. FIG. 1A depicts a side view of a full-sized processor module 14 installed in socket 10. A BGA solder interconnect 20 electrically couples contact points 22 of socket 12 to wires 24 of circuit board 12. For example, contact points 22 and pins 28 are a 48×48 land grid array (LGA). A lid 26 closes over top of processor module 14 to ensure contact between pins 28 of processor module 14 and contact points 22. A key relates a mouse bite clearance on module 14 so that two organic laminate edges intercept the A01 corner for alignment when module engagement system 18 is engaged against module 14 to register module 14 in socket 10 with pins 28 of module 14 aligned with contact points 22 of socket 10.

Figure 2:
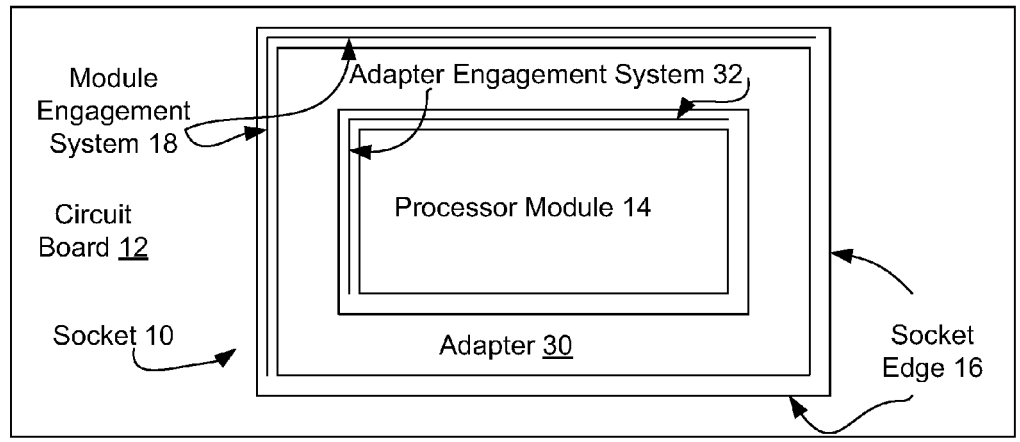
FIG. 2 depicts a top view of a socket disposed on a circuit board for accepting a processor module disposed within an adapter.
Figure 2A:
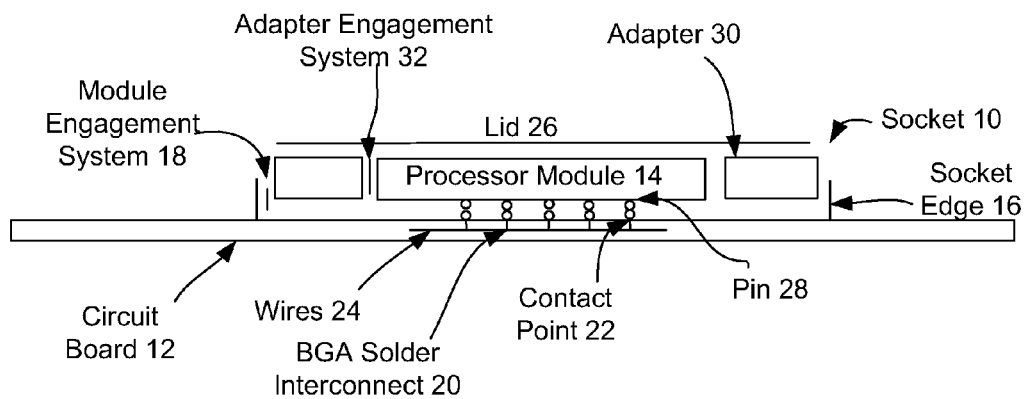
FIG. 2A depicts a side view of the smaller sized processor module installed in socket.

Referring now to FIG. 2, a top view depicts a socket 10 disposed on a circuit board 12 for accepting a processor module 14 disposed within an adapter 30. Adapter 30 engages with module engagement system 18 in the same manner as a full sized module. Adapter 30 has an opening with a perimeter sized to accept a smaller sized processor module 14. An adapter engagement system 32 engages processor module 14 within the opening of adapter 30 to align with a predetermined position. For example, the smaller sized processor module 14 is a single chip module (SCM) having four 50 mm sides that fit within the perimeter of the opening formed in adapter 30. By altering the size of the opening of adapter 30, different sized modules may be accommodated. FIG. 2B depicts a side view of the smaller sized processor module 14 installed in socket 10. Adapter 30 positions processor module 14 so that pins 28 align with desired contact points 22 as was accomplished with the full sized processor module of FIG. 1.

Without an adapter 30, socket 10 accommodates a full sized processor module having its size limited by the perimeter of socket 10, clearances, lid requirements and related physical restrictions, however, the pin array falls within the central region of socket 10. With an adapter 30, socket 10 accommodates a smaller sized processor module with a common wiring and pin array to the larger sized processor module. The smallest size available for the processor module corresponds to the minimum footprint needed for pins 28 to align with contact points 22. Although power, ground and logic pins 28 must align with power, ground and logic contact points 22, the specific utilization of a logic pin interfaced with a given wire of circuit board 12 may have varied architectural use depending upon the identity of the processor module installed in socket 10. Detection of the identity of the processor module by instructions executing on a computer will allow the computer to key the logical interface as needed for the identified processor module.

Figure 3:
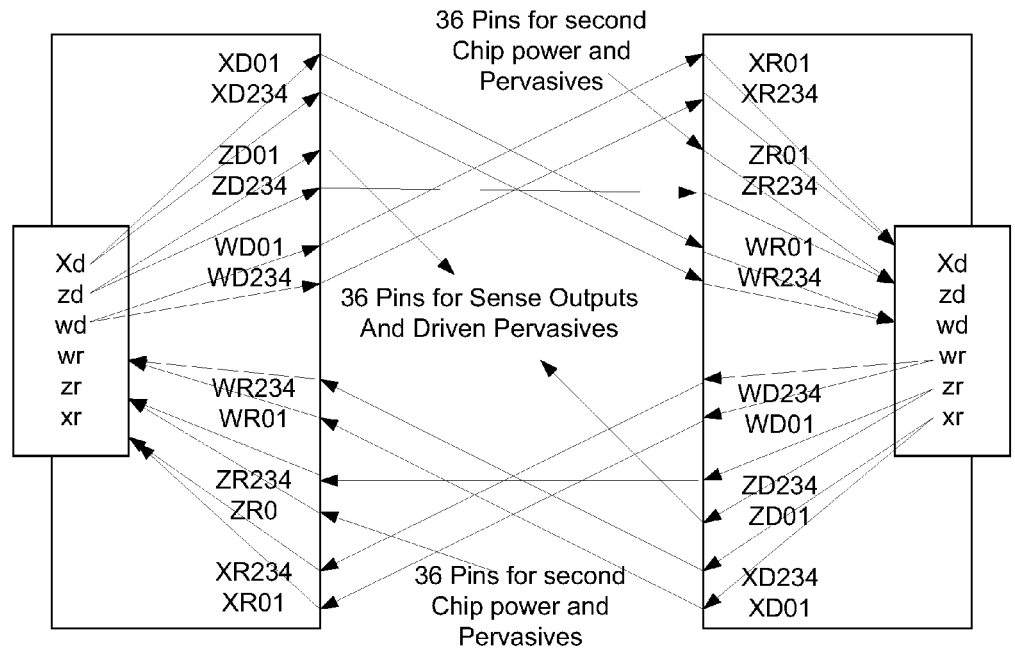
FIG. 3 depicts an example embodiment of the logical interconnect for a pair of SCMs.
Figure 4:
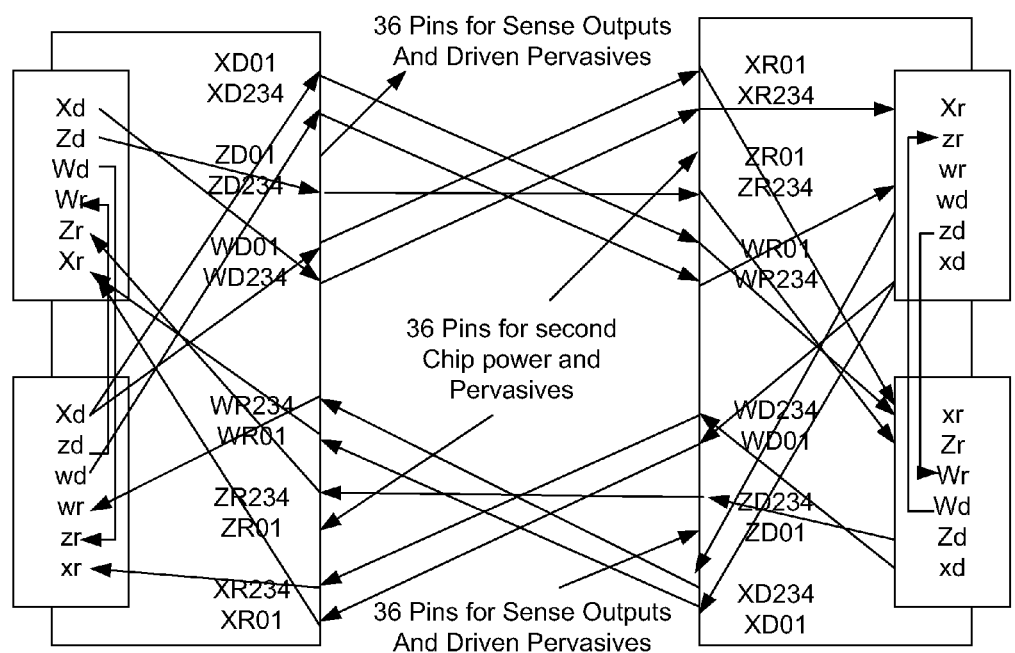
FIG. 4 depicts an example embodiment of the logical interconnect for a pair of DCMs.

One example embodiment having different architectural uses of wires depending upon the type of processor module 14 that is installed in socket 10 is a hyper-cube processor chip interconnect between a pair of SCMs versus a pair of DCMs. A two socket configuration means that four busses must communicate between sockets when DCMs populate the sockets, however, only 1 bus is required when SCMs populate the sockets. In order to ensure compatibility for both DCMs and SCMs in multi-socket configurations, extra physical lanes coupled with either wider or parallel interconnect busses are included with the sockets than are needed to support SCMs in order to have enough physical lanes on the circuit board to accommodate logical interconnects for DCMs. FIG. 3 depicts an example embodiment of the logical interconnect for a pair of SCMs and FIG. 4 depicts an example embodiment of the logical interconnect for a pair of DCMs. In the example embodiment, a common circuit board is designed to support 2 8 Byte and 1 4 Byte intra-node busses between SCMs, but only 4 Byte intra-node busses between every chip packaged across DCMs. Within each DCM, the intra-node bus contained with each DCM can be wired as an 8 Byte bus. Spare signal positions are available to feed extra control, sense and other pervasive signals needed for the second chip in each DCM. Mapping is defined for wire usage to avoid electrical or functional issues when SCMs populate the sockets. For example, any pervasive signal driven into the DCMs to support a second chip should not be assigned to a driver net on the wide SCM busses.

Figure 5A:
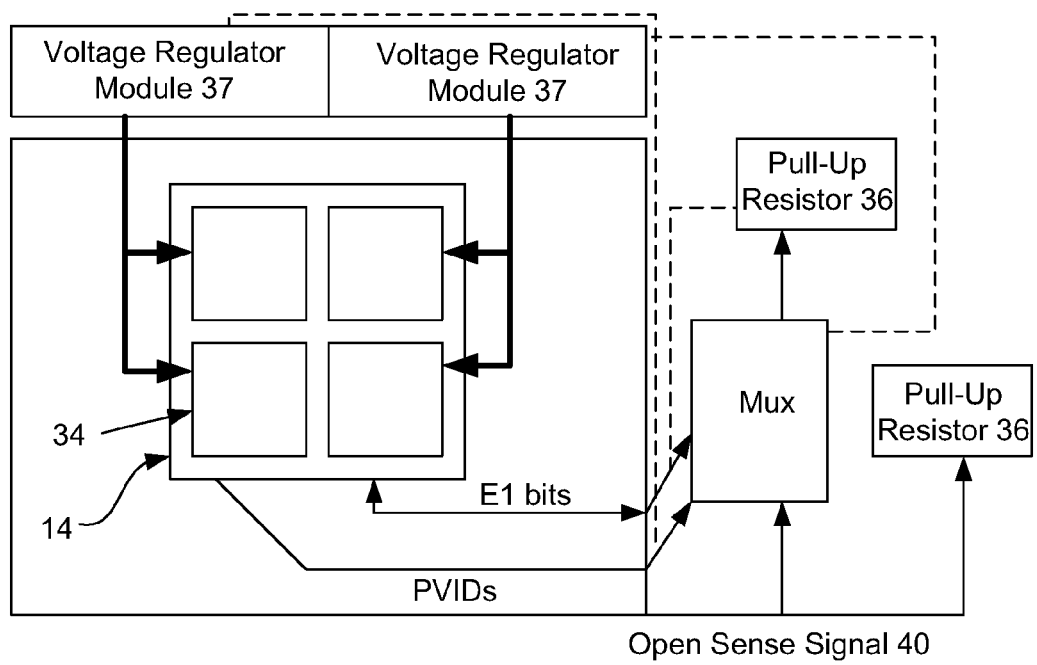
FIG. 5A depicts an SCM having four chip portions that populates a socket having two power units.
Figure 5B:
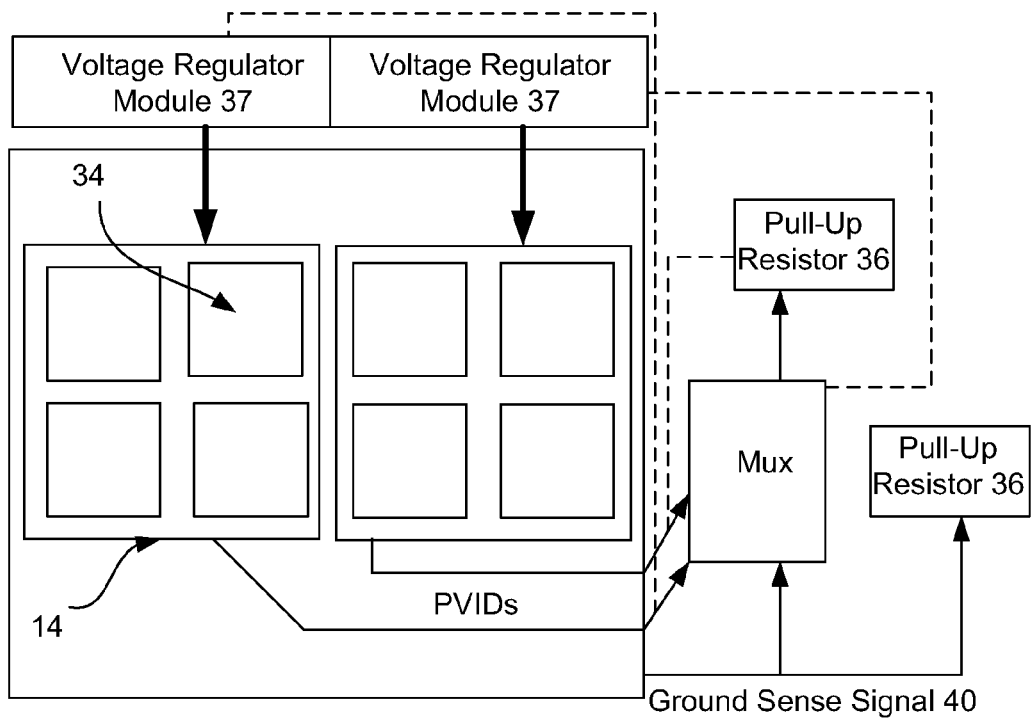
FIG. 5B a DCM having two chips that populate a socket having two power units.

Referring now to FIGS. 5A and 5B, a circuit block diagram depicts selective delivery of power at a socket 12 based upon the type of module loaded in a socket. Power is delivered to a socket 12 such that power granularity is maintained at least at a chip level to improve performance limited yield at the module level by removing some of the die matching restrictions which might otherwise be present. In FIG. 5A, an SCM 14 having four "chiplets" 34 populates a socket 10 and receives power from two voltage regulator modules (VRM) 37. The term chiplet refers to a portion of an integrated circuit chip, such as a processor core with local cache that shares a common set of power domains on the integrated circuit chip, the domains distinct from similar ones in other "chiplets." In FIG. 5B, a DCM 14 having four chiplets 34 per chip 38 populates the same socket as the SCM of FIG. 5A. A sense signal 40 is set open if an SCM populates socket 10 and is set closed if a DCM populates socket 10. With an SCM populating socket 10, power from one VRM 37 is provided to two chiplets 34 while power from the other VRM 37 is provided to the remaining two chiplets. With a DCM populating socket 10, each VRM powers a separate chip 38. Control of each VRM is managed by a multiplexor and set of pull-up resistors 36. With an SCM, parallel voltage identifiers (PVID) drive into the left-positioned VRM and are also inputs to the multiplexor. The multiplexor presents the same PVID to the VRM on the right because the multiplexor control is driven to high by the input of sense signal 40 to the lower pull-up resistor 36. With the SCM installed the E1 input to the multiplexor is ignored. With a DCM, the left chip 38 drives the left VRM as with the SCM, with the DCM carrier powering all chiplets of the left chip from the left VRM 37. Sense signal 40 is grounded with a DCM installed so that the control signal for the multiplexor is pulled low and the output of the multiplexor is driven to reflect the values of PVID bits from the right chip 38 that are sent through what was E1 signal lines for the SCM. Thus, the values of the PVID from the right chip 38 drive the right VRM when a DCM is installed.

Figure 6:
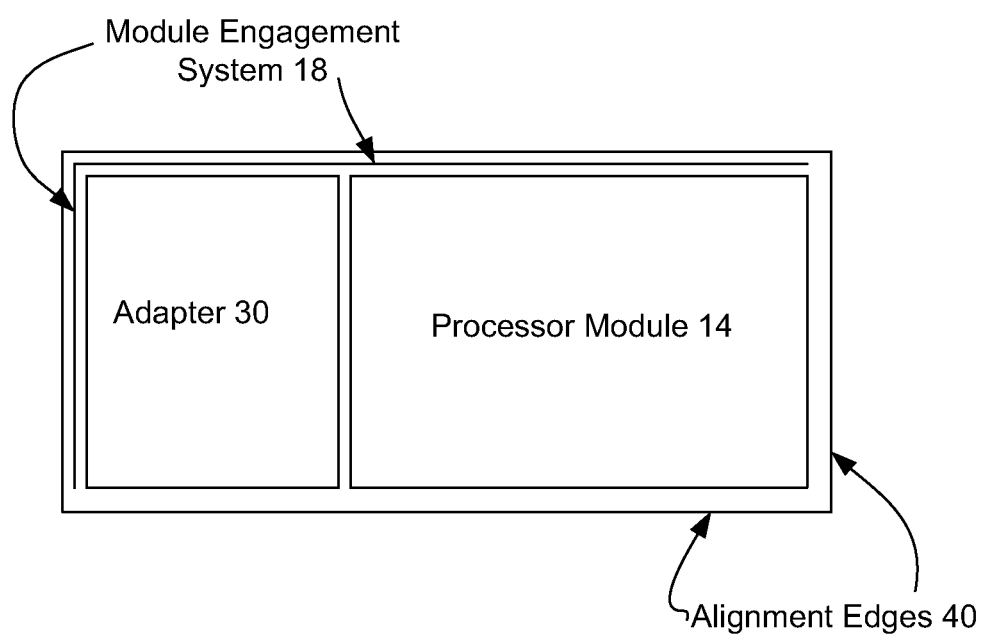
FIG. 6 depicts an SCM installed against alignment edges at one side of socket with an adapter inserted in socket to provide alignment of desired pins and contact points.

The multi-application socket adapts well to conventional SCM and DCM lidded modules where the heatsink, load plate and stiffener apply a center point load to the assembled module and socket. Locating contact points towards the center of the socket allows the use of smaller modules having pins that align with the contact points used for larger modules. However, in some situations, a smaller module might operate better if the smaller module is placed to one side of the socket footprint available from the larger module. One example of such a situation is a ceramic module, which tends to have poor lateral power distribution so that power distribution is best when assigned directly under the high power die shadows of a DCM or SCM. FIG. 6 depicts an example embodiment of a multi-application socket which is designed to accommodate ceramic technology for a DCM as well as ceramic or organic technology for an SCM. FIG. 6 depicts an SCM 14 installed against alignment edges 40 at one side of socket 10 with an adapter 30 inserted in socket 10 to provide alignment of desired pins and contact points. Adapter 30 engages with SCM 14 on one side and module engagement system 18 on the opposing side so that a biasing force applied by module engagement system 18 is applied to SCM 14 without including a separate adapter engagement system. Adapter 30 secures to SCM 14 in a variety of ways, such as clips that limit z axis movement, engagement with holes in the socket surface where contact points are not present, or a sidewall tongue and groove that maintains z axis position.

With the adapter 30 located to one side as depicted by FIG. 6, an SCM and DCM can accommodate a common key at the A01 corner that is the vertex for the alignment edges 40. For example, the key accommodates either the mouse bite required for organic modules and or the A01 chamfer required for ceramic modules. The signal array contact points to support both the SCM or DCM is contained at the portion of socket 10 where the SCM aligns and is arranged accommodate all common signaling as well as power delivery to the chip that sits over the array, whether an SCM or a DCM. The array under adapter 30 is exposed to support a DCM when adapter 30 is removed, such as contact points to power the second chip of the DCM and the control, sense and other pervasive signals associated with the second chip of the DCM. In addition, functional paths and or bus widths may be included if helpful in a DCM populated system.

Although the present invention has been described in detail, it should be understood that various changes, substitutions and alterations can be made hereto without departing from the spirit and scope of the invention as defined by the appended claims.

What is claimed is:

1. A system for interfacing a processor module with a circuit board, the system comprising:
    a socket having a plurality of contact points and an interconnect, the interconnect operable to electrically couple each of the plurality of contact points to the circuit board;
    a module engagement system associated with the socket and operable to engage a first processor module in the socket to align predetermined of a plurality of pins of the first processor module with predetermined of the plurality of contact points;
    an adapter having an opening sized to accept a second processor module, the adapter sized to engage in the module engagement system to align predetermined of the plurality of pins of the second processor module with predetermined of the plurality of contact points when the adapter is engaged in the module engagement system and the second processor module is placed in the opening; and
    an adapter engagement system associated with the adapter and operable to engage the second processor module in the adapter opening;
    wherein the module engagement system comprises an edge formed along a portion of the perimeter of the socket and a spring lever disposed along a portion of the perimeter opposite the edge and operable to bias the first processor module against the edge.

2. The system of claim 1 wherein the first processor module comprises a dual chip module and the second processor module comprises a single chip module.

3. The system of claim 1 wherein the adapter comprises a single contiguous piece having a shape of the first processor module with the opening of the adapter having a shape of the second processor module.

4. The system of claim 1 wherein the socket contact points comprise one or more power pins, one or more ground pins and a plurality of logic pins, and wherein the adapter aligns power pins and ground pins of the second processor module with power contact points and ground contact points of the first processor module.

5. The system of claim 4 further comprising a key that assigns logical functions to logic pin contact points based upon the identity of the module engaged in the socket.

6. The system of claim 5 wherein the logical functions comprise a first number of busses communicating with a second socket if the first processor module is engaged in the socket and a second number of busses communicating with the second socket if the second processor module is engaged.

7. The system of claim 1 wherein the module engagement system comprises a lid that closes over the socket.

8. A system for interfacing a processor module with a circuit board, the system comprising:
    a socket having a plurality of contact points disposed within four edges and an interconnect, the interconnect operable to electrically couple each of the plurality of contact points to the circuit board;
    a module engagement system associated with the socket and operable to engage a first processor module in the socket to align predetermined of a plurality of pins of the first processor module with predetermined of the plurality of contact points, the first processor module having a perimeter, the module engagement system engaging the first processor module to hold the perimeter proximate the edges;
    an adapter sized to engage in the module engagement system at a first of the edges and to engage a second processor module to align predetermined of a plurality of pins of a second processor module with predetermined of the plurality of contact points when the adapter is engaged in the module engagement system and the second processor module is placed adjacent the adapter; and
    an adapter engagement system associated with the adapter and operable to engage the second processor module proximate the adapter engagement system and at a second edge opposing the first edge;
    wherein the first processor module comprises a dual chip module and the second processor module comprises a single chip module, the system further comprising logic to allocate logical functions to the plurality of contact points based upon the identity of the processor module engaged in the socket as a dual chip module or a single chip module.

9. The system of claim 8 wherein one or more of the first and second processor modules comprises a ceramic material.

10. A method for engaging first and second processor modules in a socket, the method comprising:
    engaging the first processor module in the socket by placing an outer perimeter of the first processor module proximate an inner perimeter of the socket to align predetermined pins of the first processor module with predetermined contact points of the socket; and
    engaging the second processor module in the socket by placing an outer perimeter of an adapter proximate an inner perimeter of the socket, the adapter having an opening, the opening having an inner perimeter, and placing the second processor module in the opening to have an outer perimeter of the second processor module proximate the inner perimeter of the opening to align predetermined pins of the first processor module with predetermined contact points of the socket;
    wherein engaging the first processor module comprises biasing the first processor module toward a socket edge with a spring lever and engaging the second processor module comprises biasing the adapter toward the socket edge with the spring lever.

11. The method of claim 10 wherein the first processor module comprises a dual chip module and the second processor module comprises a single chip module.

12. The method of claim 10 further comprising allocating logical functions to contact points based upon the identity of the processor module engaged in the socket.

13. The method of claim 10 wherein the socket contact points comprise one or more power pins and one or more ground pins, and wherein the adapter aligns power pins and ground pins of the second processor module with power contact points and ground contact points of the first processor module.

14. The method of claim 10 wherein engaging the second processor module further comprises biasing the second processor module toward an edge of the adapter inner perimeter with a spring lever.

15. The method of claim 10 wherein the adapter comprises a single contiguous piece having a shape of the first processor module with the opening of the adapter having a shape of the second processor module.

16. The method of claim 10 further comprising closing a lid over the socket.

17. A method for engaging first and second processor modules in a socket, the method comprising:
  engaging the first processor module in the socket by placing an outer perimeter of the first processor module proximate an inner perimeter of the socket to align predetermined pins of the first processor module with predetermined contact points of the socket;
  engaging the second processor module in the socket by placing an outer perimeter of an adapter proximate an inner perimeter of the socket, the adapter having an opening, the opening having an inner perimeter, and placing the second processor module in the opening to have an outer perimeter of the second processor module proximate the inner perimeter of the opening to align predetermined pins of the first processor module with predetermined contact points of the socket;
  installing a first processor module in the socket, the first processor module comprising dual chips;
  allocating a first power unit to a first chip of the first processor module; and
  allocating a second power unit to a second chip of the second processor module.

18. The method of claim 17 further comprising:
  installing a second processor module in the socket, the second processor module installed within the adapter opening and having a single chip with a first portion and a second portion;
  allocating the first power unit to the first portion; and
  allocating the second power unit to the second portion.

* * * * *